United States Patent [19]
Maki et al.

[11] Patent Number: 5,455,443
[45] Date of Patent: Oct. 3, 1995

[54] CCD IMAGER WITH OVERFLOW DRAIN

[75] Inventors: Yasuhito Maki; Satoshi Yoshihara, both of Kanagawa, Japan

[73] Assignee: Sony Corporation, Tokyo, Japan

[21] Appl. No.: 226,044

[22] Filed: Apr. 11, 1994

[30] Foreign Application Priority Data

Apr. 9, 1993 [JP] Japan ................. 5-083362
Apr. 13, 1993 [JP] Japan ................. 5-086381

[51] Int. Cl.⁶ .................. H01L 29/796; H01L 27/14; H01L 31/00
[52] U.S. Cl. .................. 257/323; 257/230; 257/233; 257/234
[58] Field of Search .................. 257/223, 230

[56] References Cited

U.S. PATENT DOCUMENTS

| | | | |
|---|---|---|---|
| 3,896,474 | 7/1975 | Amelio et al. | 257/223 |
| 4,489,423 | 12/1984 | Suzuki | 257/223 |
| 5,235,196 | 8/1993 | Anagnostopoulos et al. | 257/223 |

*Primary Examiner*—Gene M. Munson
*Attorney, Agent, or Firm*—Hill, Steadman & Simpson

[57] ABSTRACT

A CCD solid state imaging device has an overflow mechanism to discharge excess electric charges at the sensor section. An overflow level can be stabilized without adjustment. The CCD solid state imaging device includes an overflow barrier region for determining an amount of electric charges handled by a sensor section, and an overflow drain region for discharging excess electric charges at the sensor section adjacent to the sensor section. An intermediate region having the same potential as that of the sensor portion is provided between the overflow barrier region and the overflow drain region. Also, a CCD solid state imaging device includes linear sensors provided in a plurality of lines and vertical transfer registers provided at end of the linear sensors in the charge transfer direction of the horizontal transfer registers. When signal charges are overflowed in a part of the horizontal transfer register, signals of all pixels can be avoided from being destroyed. In a CCD solid state imaging device having linear sensors arranged in a plurality of lines, and vertical transfer registers provided at ends of the linear sensors in the charge transfer direction of the horizontal transfer registers, there is formed a limit region for limiting electric charges to a predetermined amount before electric charges are transferred from the horizontal transfer register to the vertical transfer register.

8 Claims, 16 Drawing Sheets

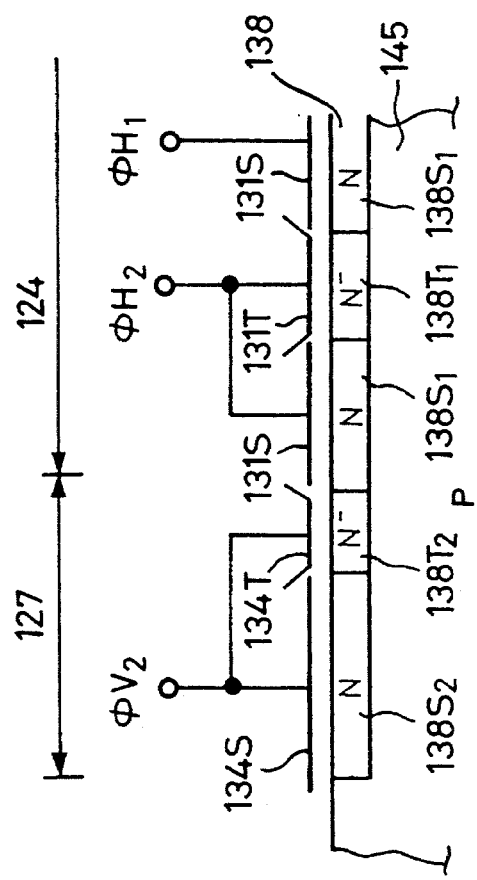
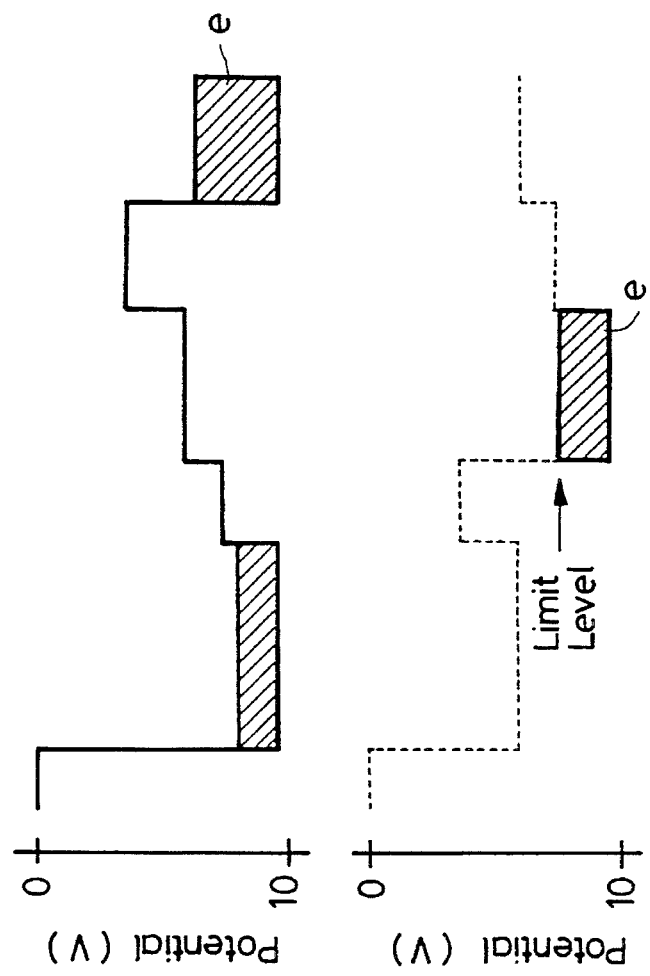
FIG.15A
FIG.15B
FIG.15C 5,455,443

CCD IMAGER WITH OVERFLOW DRAIN

BACKGROUND OF THE INVENTION

1. Field of the Invention

The present invention relates to a charge-coupled device (CCD) and a CCD solid state imaging device, such as an area sensor, a linear sensor or the like.

2. Description of the Prior Art

Heretofore, CCD solid state imaging devices, such as an area sensor, a linear sensor or the like, include an overflow mechanism to discharge excess electric charges produced when a sensor section thereof senses a large quantity of light. As such an overflow mechanism, there is known an overflow mechanism which includes an overflow control gate section and an overflow drain region provided in the lateral direction to thereby adjust an overflow level by a gate voltage from the overflow control gate section, or a mechanism in which an overflow level is set by a potential barrier without using the gate voltage.

A CCD solid state imaging device having such an overflow mechanism, i.e., a linear sensor, will be described below.

FIG. 1 of the accompanying drawings shows an example of a conventional linear sensor having an overflow control gate section. As shown in FIG. 1, a linear sensor 1 is comprised of a sensor array 3 in which a plurality of sensor sections (photo-sensing sections) 2 are arranged in a one-dimensional fashion in the horizontal direction, a horizontal transfer register 5 having a CCD structure provided on one side of the sensor array through a read-out gate section 4, an overflow control gate section 6 provided adjacent to the other side of the sensor array 3 to determine an overflow level and an overflow drain region 7 for discharging excess electric charges. Furthermore, the linear sensor 1 includes an output section 8 connected to the final stage of the horizontal transfer register 5, and the output section 8 includes a charge-to-voltage converting section for converting a signal charge transferred thereto from the horizontal transfer register 5 into a voltage.

FIG. 2 is a cross-sectional view taken along the line II—II in FIG. 1. As shown in FIG. 2, in this linear sensor 1, an N-type impurity diffusion region 12 is formed on a P-type well region 11 and a P-type positive charge accumulation region 13 is formed on the surface of the N-type impurity diffusion region 12, and the sensor section (photoelectric conversion section) 2 is formed by a PN junction photodiode provided therein. The overflow drain region 7 is formed by an N-type impurity diffusion layer. The overflow drain region 7 and the sensor section 2 have the overflow control gate section 6 therebetween having a gate electrode 14 to which a predetermined gate voltage $V_{OFCG}$ is applied through a gate insulating film.

The horizontal transfer register 5 includes a plurality of transfer sections 16 having a storage gate electrode 15s formed of a first polycrystalline silicon layer and a transfer gate electrode 15t formed of a second polycrystalline silicon layer along a charge transfer direction a. The horizontal transfer register 5 is driven by two-phase clock pulses $\phi H_1$ and $\phi H_2$. The read-out gate section 4 includes a read-out gate electrode 17 to which a read-out gate pulse $\phi ROG$ is applied through the gate insulating film. The read-out gate section 4 is connected to a transfer section having the transfer gate electrode 15t of the horizontal transfer register 5.

In the linear sensor 1, signal charges photoelectrically-converted by each sensor section 2 are read out through the read-out gate section 4 to the horizontal transfer register 5, transferred within the horizontal transfer register 5 in the arrow a direction, photoelectrically-converted and then sequentially outputted through an output section 8.

The overflow control gate section 6 fixes a potential (i.e., potential barrier) $V_{ofb1}$ when applied with the predetermined gate voltage $V_{OFCG}$ as shown in FIGS. 2A, 2B. A maximum amount of electric charges handled by the sensor section 2 is determined by a barrier height $\Delta V_{b1}$ provided between the potential $V_{ofb1}$ and a potential Vs formed under the sensor section 2. If many electric charges are generated by the sensor section 2 when the sensor section 2 senses a large quantity of light, excess electric charges are discharged to the overflow drain region 7 through the potential barrier $V_{ofb1}$ formed under the overflow control gate section 6.

FIG. 3 and FIGS. 4A, 4B show another example of a conventional linear sensor having an overflow barrier region. In FIG. 3 and FIGS. 4A, 4B, like parts corresponding to those of FIG. 1 and FIGS. 2A, 2B are marked with the same references and therefore need not be described in detail.

As illustrated, a linear sensor 19 is comprised of the sensor array 3 formed of a plurality of sensor sections 2, the horizontal transfer register 5 having the CCD structure provided at one side of the sensor array 3 through the read-out gate section 4, the output section 8 connected to the final stage of the horizontal transfer register 5, an overflow barrier region 18 provided adjacent to the other side of the sensor array 3 to determine an overflow level and the overflow drain region 17 for discharging excess electric charges.

FIG. 4A is a cross-sectional view taken along the line IV—IV in FIG. 3. As shown in FIG. 4A, the overflow barrier region 18 includes an $N^-$ type impurity diffusion region 20 having a donor concentration lower than that of the N-type impurity diffusion region 12 forming the sensor section 2 formed under an extended section 13a of a P-type positive electric charge accumulation region 13. The N-type impurity diffusion region 20 forms a potential (i.e., potential barrier) $V_{ofb2}$ which is shallower than the potential Vs of the sensor section 2, and a maximum amount of electric charges handled by the sensor section 2 is determined by a barrier height $\Delta V_{b2}$. Structures of the sensor section 2, the horizontal transfer register 5, the overflow drain region 7, etc., are similar to those of FIG. 2A.

In this linear sensor, when many electric charges are generated from the sensor section 2, the excess electric charges are discharged to the overflow drain region 7 through the potential barrier $V_{ofb2}$ formed under the overflow barrier region 18.

In the case of the former linear sensor 1, as shown in FIGS. 2A, 2B, the potential $V_{ofb1}$ formed under the overflow control gate section 6 is substantially fixed by the gate voltage $V_{OFCG}$. Therefore, while the fluctuation of the barrier height $\Delta V_{b1}$ is small when the potential of the overflow drain region 7 is fluctuated (see a broken line in FIG. 2B), if the potential Vs of the sensor section 2 is deviated (see a one-dot chain line in FIG. 2B) from a design value, then the barrier height $V_{b1}$ is changed and a so-called overflow level is changed. A curve I in FIG. 5 shows a relationship between an exposure amount and an amount of signal charges thus read-out. Accordingly, this linear sensor 1 should adjust the gate voltages of the overflow control gate section 6 separately in response to the deviated amount of the potential Vs of the sensor section 2 from the design value. Thus, the linear sensor 1 cannot provide a stable overflow characteristic without substantially adjustment.

In the case of the latter linear sensor 19, as shown in FIGS. 4A, 4B, the fluctuation of the potential $V_{ofb2}$ of the overflow barrier region 18 is small when the potential Vs of the sensor section 2 is fluctuated (see a one-dot chain line in FIG. 4B). However, when the voltage of the overflow drain region 7 is fluctuated (see a broken line in FIG. 4B), the potential $V_{ofb2}$ formed under the overflow barrier region 18 is modulated (shown by the broken line in FIG. 4B) so that the barrier height $\Delta V_{b2}$ is changed. Therefore, the linear sensor 19 cannot stabilize an overflow characteristic without adjustment.

The conventional overflow drain structure which discharges excess electric charges will be described further. A vertical type overflow drain structure or a horizontal type overflow drain structure in practice will now be described.

FIG. 6 shows a conventional CCD solid state imaging device 21 which comprises linear sensors arrayed in a plurality of lines and vertical transfer registers added thereto.

As shown in FIG. 6, the CCD solid state imaging device 21 includes linear sensors 26 formed of sensor arrays 23 in which a plurality of sensor sections (photo-sensing sections) 22 are arranged in a one-dimensional fashion in the horizontal direction, horizontal transfer registers 24 having a CCD structure provided on one side of the sensor arrays 23 and read-out gate sections 25 provided between the sensor arrays 23 and the horizontal transfer registers 24. In this case, the linear sensors 26 are provided in a plurality of lines, in this example, 3 lines in the vertical direction. A vertical transfer register 27 having a CCD structure is provided at the end of the charge transfer direction of the horizontal transfer registers 24 (24A, 24B, 24C) of respective lines. Further, an output section 28 is connected to the final stage of the vertical transfer register 27, and the output section 28 includes a charge-to-voltage converting unit for converting signal charges transferred within the vertical transfer register 27 into voltages.

Though not shown, the CCD solid state imaging device 21 includes a vertical or horizontal overflow mechanism. When the sensor section 22 photo-senses a large quantity of light, excess charges are discharged to the vertical or horizontal overflow mechanism.

Common two-phase clock pulses $\phi H_1$ and $\phi H_2$ are applied to the horizontal transfer registers 24 (24A, 24B, 24C) of respective lines. A common read-out gate pulse $\phi ROG$ is applied to the read-out gate section 25, and drive pulses, i.e., two-phase clock pulses $\phi V_1$ and $\phi V_2$, are applied to the vertical transfer register 27.

FIG. 7 is a diagram showing a transfer section for transferring signal charges from the horizontal transfer register 24 to the vertical transfer register 27 in an enlarged scale. In the horizontal transfer register 24, a transfer section 33 is comprised of a storage section 32S having a storage gate electrode 33S formed of a first polycrystalline silicon layer and a transfer section 32T having a transfer gate electrode 31T formed of a second polycrystalline silicon layer. There are formed a plurality of stages of the transfer sections 33. The storage gate electrodes 31S and the transfer gate electrodes 31T of the respective transfer sections 33 are connected commonly to the two-phase clock pulses $\phi H_1$ and $\phi H_2$ in alternate fashion.

In the vertical transfer register 27, a transfer section 36 is comprised of a storage section 35S having a storage gate electrode 34S formed of a first polycrystalline silicon layer and a transfer section 35T having a transfer gate electrode 34T formed of a second polycrystalline silicon layer. There are provided a plurality of stages of the transfer sections 36. The storage gate electrodes 34S and the transfer gate electrodes 34T of the transfer sections 36 are connected commonly to the two-phase clock pulses $\phi V_1$ and $\phi V_2$ in alternate fashion.

The storage section 32S of the transfer section 33 of the final stage of the horizontal transfer register 24 is connected to the transfer section 35T of the predetermined transfer section 36 of the vertical transfer register 27.

A gate electrode 37 of the read-out gate section 25 provided between the sensor section 22 and the horizontal transfer register 24 is formed of a first polycrystalline silicon layer. The read-out gate section 25 is connected to the transfer section 32T of the horizontal transfer register 24. A dashed line 18 in FIG. 7 shows a transfer channel region.

The clock pulses $\phi H_1$, $\phi H_2$, $\phi V_1$, $\phi V_2$, $\phi ROG$ are applied to the CCD solid state imaging device 21 at timings shown in FIG. 8, so that signal charges of the sensor arrays 23 (123A, 23B, 23C) of the respective lines are read out through the read-out gate sections 25 (25A, 25B, 25C) to the corresponding horizontal transfer registers 24 (24A, 24B, 24C). The signal charges supplied thereto are sequentially transferred at every signal charge of one pixel of each line to the vertical transfer register 27. The signal charges transferred to the vertical transfer register 27 are transferred in the vertical direction and then sequentially output through the output section 28.

As the outputs signals there can be obtained an output signal of the left-hand end sensor 22 (D1-1) of the first line, an output signal of the left-hand end sensor 22 (D2-1) of the second line, and an output signal of the left-hand end sensor 22 (D3-1) of the third line, in that order. Output signals will be obtained hereinafter in similar fashion.

In the conventional CCD solid state imaging device, the excess signal charges generated when the sensor section photo-senses a large quantity of light are discharged to the vertical or horizontal overflow mechanism as described above. If, however, excess electric charges which are photoelectrically converted are transferred to the transfer register or if light is leaked to the transfer register (i.e., so-called smear occurs) when signal charges are read out from the sensor section, then electric charges are overflowed in the transfer register to destroy signals of other pixels.

In the case of the CCD solid state imaging device 21 shown in FIGS. 6 and 7, if electric charges are overflowed in an arbitrary transfer section 33 of the horizontal transfer register 24 of a certain line, then electric charges are initially overflowed to the transfer section 33 provided before and after the arbitrary transfer section 33 to destroy a signal of that line. If electric charges are overflowed in a larger scale, then electric charges are overflowed in the vertical transfer register 27 so that signals of all pixels are destroyed.

Therefore, if a very large quantity of light is radiated on a certain small portion, there is then the possibility that signals of all pixels are destroyed. This is also true in the case that, even though the CCD solid state imaging device includes the overflow mechanism (so-called vertical or horizontal overflow mechanism, etc.) suppress electric charges from being overflowed in the simple sensor section, if a large amount of photoelectrically-converted electric charges are transferred to the horizontal transfer register when a smear occurs in the horizontal transfer register 24, i.e. a signal is read out, or when the read-out gate is opened.

OBJECTS AND SUMMARY OF THE INVENTION

It is therefore an object of the present invention to provide an improved CCD solid state imaging device in which the aforesaid shortcomings and disadvantages encountered with the prior art can be eliminated.

It is another object of the present invention to provide a CCD solid state imaging device in which a potential barrier can be made free from adjustment.

It is still another object of the present invention to provide a CCD solid state imaging device which can provide a stable overflow characteristic.

It is a further object of the present invention to provide a CCD solid state imaging device in which signals of all lines can be avoided from being destroyed even when electric charges are overflowed in a transfer register of a certain line.

According to a first aspect of the present invention, there is provided a CCD solid state imaging device which is comprised of a photoelectric converting section formed on the surface of a semiconductor substrate, a charge read-out section for reading out signal charges photoelectrically-converted by the photoelectric converting section, an overflow drain region for discharging excess electric charges supplied thereto from the photoelectric converting section, an overflow barrier region for determining a level of excess electric charges supplied thereto from the photoelectric converting section, and an intermediate region provided between the overflow drain region and the overflow barrier region, the intermediate region having a potential deeper than that of the overflow barrier region and which is shallower than that of the overflow drain region.

According to a second aspect of the present invention, there is provided a charge couple device which is comprised of a photo-sensing section for accumulating signal charges when the photo-sensing section photo-senses light, a first transfer section for transferring the signal charges in one direction, a second transfer section provided at the end portion of a signal transfer direction of the first transfer section, and a device for limiting an amount of signal charges supplied to the second transfer section.

The above and other objects, features, and advantages of the present invention will become apparent from the following detailed description of illustrative embodiments thereof to be read in conjunction with the accompanying drawings.

BRIEF DESCRIPTION OF THE DRAWINGS

FIG. is a schematic diagram showing a structure of an example of a conventional linear sensor;

FIG. 15A is a cross-sectional view taken along the line XV—XV in FIG. 14;

FIGS. 15B, 15C are potential diagrams thereof;

DETAILED DESCRIPTION OF THE PREFERRED EMBODIMENTS

The present invention will now be described with reference to the drawings.

A CCD solid stage imaging device according to a first embodiment of the present invention will be described below with reference to FIG. 9 to FIGS. 11A, 11B. In this embodiment, the present invention is applied to the linear sensor.

Figure 9:
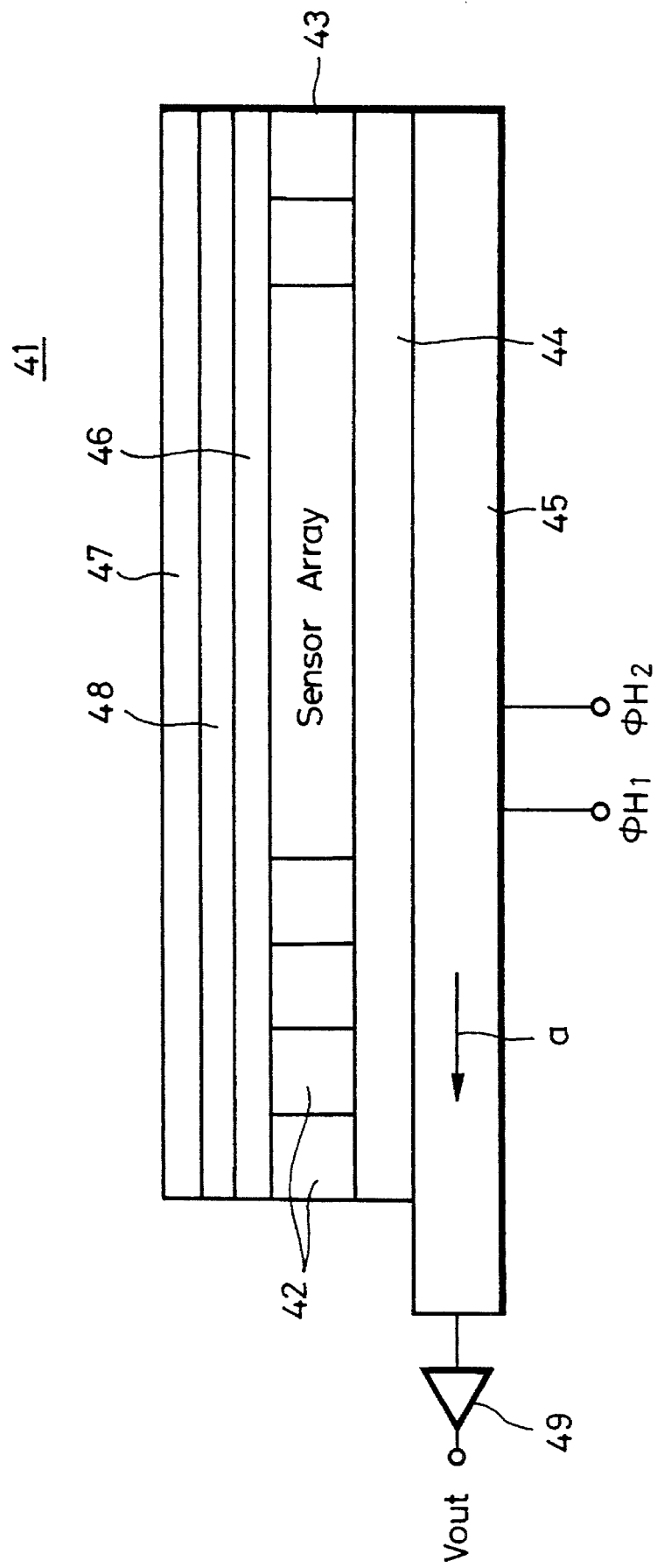
FIG. 9 is a schematic diagram showing a structure of a linear sensor according to a first embodiment of the present invention.

As shown in FIG. 9, a linear sensor 41 according to this embodiment is comprised of a sensor array 43 in which a plurality of sensor sections (photo-sensing sections) 42 are arranged in a one-dimensional fashion in the horizontal direction, a horizontal transfer register 45 having a CCD structure provided at one side of the sensor array 43 through a read-out gate section 44, an overflow barrier region 46 provided adjacent to the other side of the sensor array 43 to determine the overflow level, an overflow drain region 47 for discharging excess electric charges, and an intermediate region 48 provided between the overflow barrier region 46 and the overflow drain region 47 having the same potential as that of the sensor section 42. Further, an output section 49 is connected to the final stage of the horizontal transfer register 45, and the output section 49 has a charge-to-voltage converting section for converting signal charges transferred thereto from the horizontal transfer register 45 into a voltage.

Figure 10:
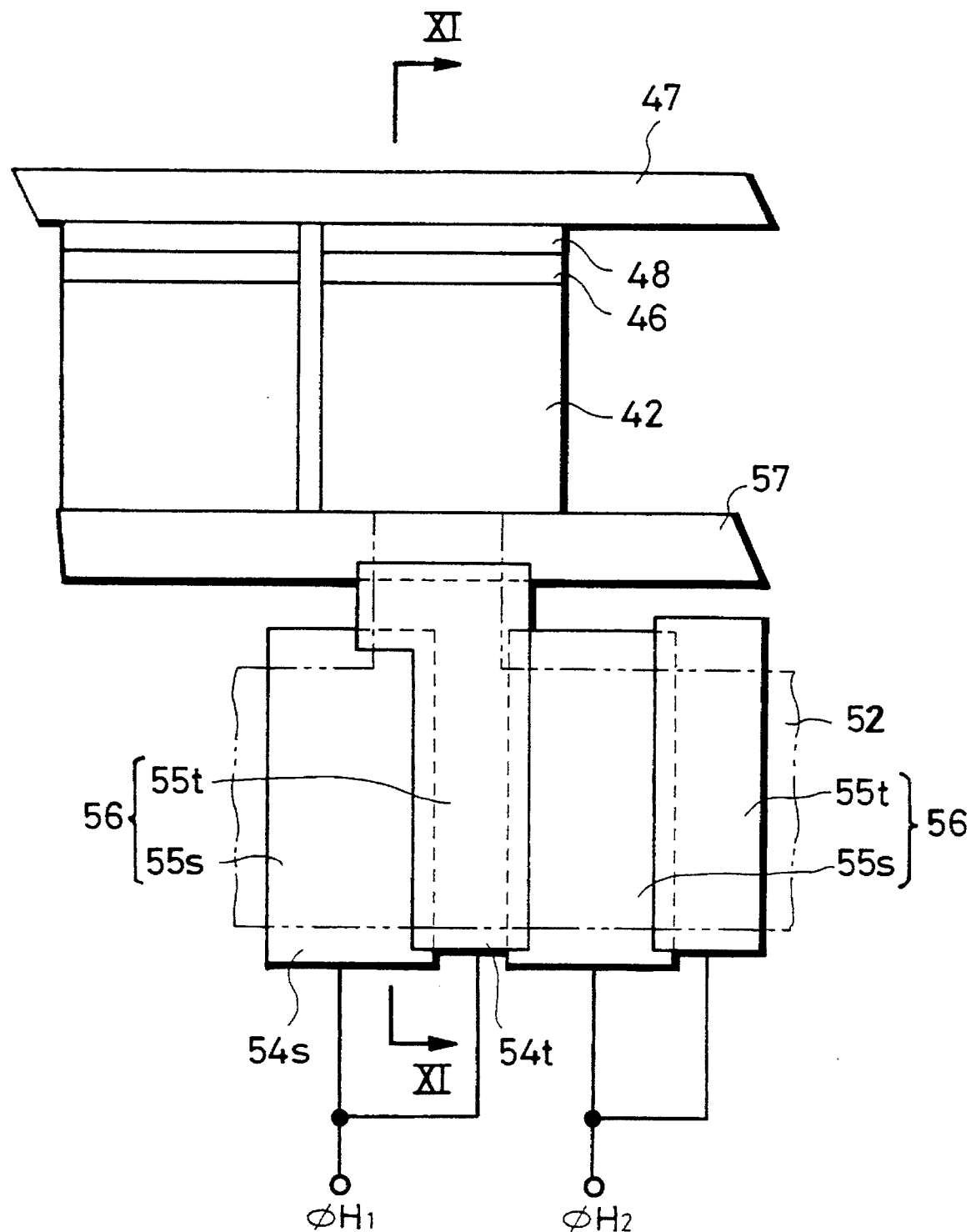
FIG. 10 is a diagram showing a main portion of the linear sensor shown in FIG. 9 in an enlarged scale.
Figures 11A, 11B:
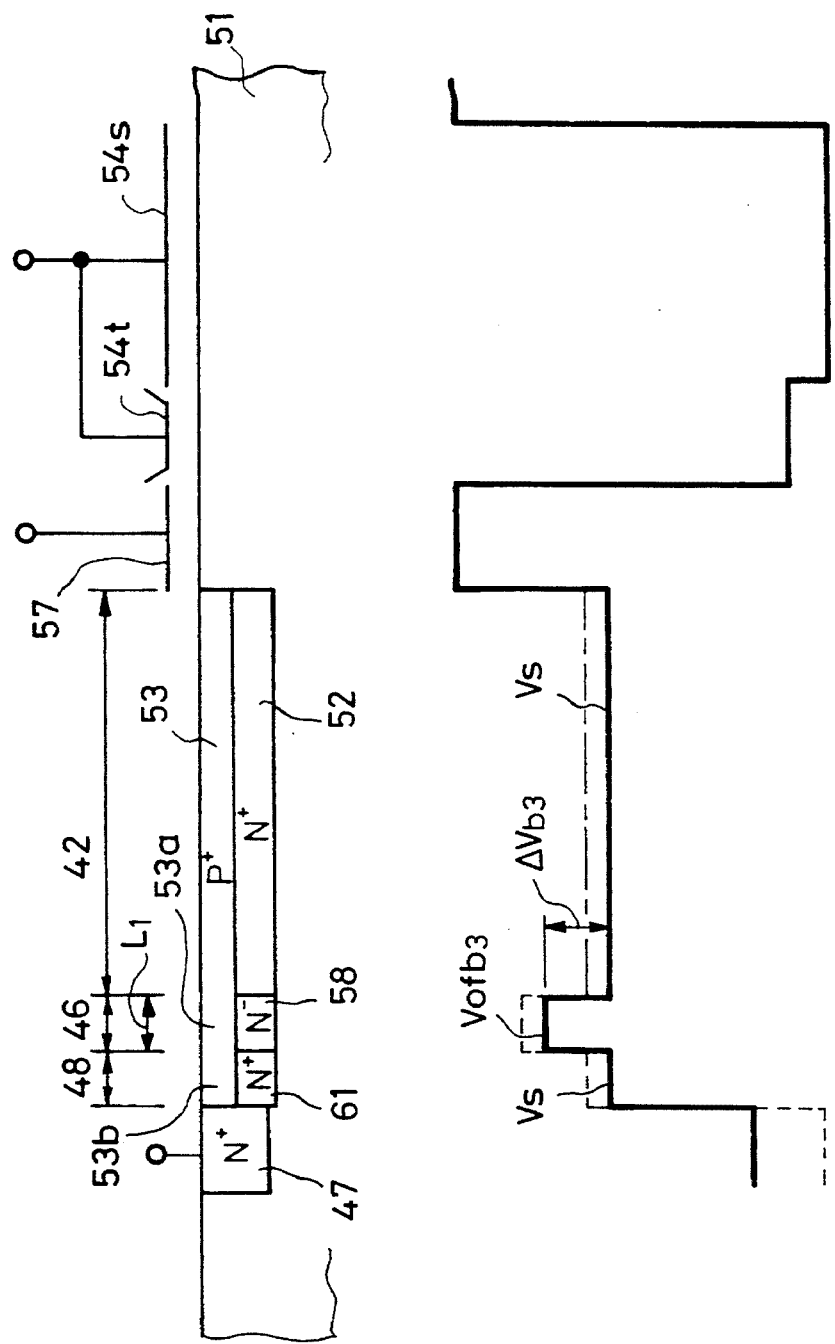
FIG. 11A is a cross-sectional view taken along the line XI—XI in FIG. 10.
FIG. 11B is a potential diagram used to explain the linear sensor shown in FIG, 9.

FIG. 10 is a plan view of a main portion of FIG. 9. FIG. 11A is a cross-sectional view taken along the line XI—XI in FIG. 10, and FIG. 11B is a potential diagram therefor. In this linear sensor 41, on a well region 51 of a first conductivity type, e.g., P type is formed an impurity diffusion region 52 of a second conductivity type, e.g., N type having a high donor concentration. A P-type positive electric charge accumulation region 53 is formed on the surface of the impurity diffusion region 52. Then, the sensor section (photoelectric converting section) 42 is constructed by a PN-junction photo-diode formed therein.

In the horizontal transfer register 45, a transfer section 56 is comprised of a storage section 55s having a storage gate electrode 54s formed of a first polycrystalline silicon layer and a transfer gate electrode 54t formed of a second polycrystalline silicon layer along the charge transfer direction a. There are formed a plurality of stages of the transfer sections 56 which are driven by drive pulses, e.g., two-phase clock pulses $\phi H_1$ and $\phi H_2$.

The read-out gate section 44 includes a read-out gate electrode 57 formed of a first polycrystalline silicon layer which is made common to the respective sensor sections 44 through a gate insulating film. The read-out gate pulse $\phi ROG$ is applied to the read-out gate section 54. A transfer section 55t of one-bit transfer section corresponding to each of the sensor sections 44 is connected to the read-out gate section 54.

The overflow drain region 47 is formed of an N-type impurity diffusion layer which is made common to each sensor section 44. The overflow barrier region 46 includes an $N^-$ type impurity diffusion region 58 having a donor concentration lower than that of an N-type impurity diffusion region 52 which forms the sensor section 44 under the extended portion 53a of a P-type positive electric charge accumulation region 53 in response to each sensor section 44. As shown in the potential diagram of FIG. 11B, an amount of electric charges that are handled by the sensor section 42 is determined by the barrier height $\Delta V_{b3}$ provided between the potential $V_{ofb3}$ of the overflow barrier region 46 and the potential Vs of the sensor section 42.

An intermediate region 48 provided between the overflow drain region 47 and the overflow barrier region 46 has the same structure as that of the sensor section 44, i.e., formed of an N-type impurity diffusion region 61 having a high donor concentration and an extended portion 53b of the P-type positive electric charge accumulation region 53 formed on the surface of the N-type impurity diffusion region 61. In FIG. 10, reference numeral 52 depicts a transfer channel region.

The sensor section 42, the overflow barrier region 46 and the intermediate region 48 are formed as follows. An N-type impurity diffusion region having a high donor concentration is formed by an ion implantation of N-type impurity over the area ranging from the sensor section 42 to the intermediate region 48 and then the $N^-$ type impurity diffusion region 58 having a low donor concentration is formed by partly carrying out the ion implantation of a P-type impurity, such as boron or the like, on a portion corresponding to the overflow barrier region 46. Thereafter, the sensor section 42, the overflow barrier region 46 and the intermediate region 48 are formed by forming the P-type positive electric charge accumulation regions 53 (53a, 53b). According to this process, only one ion implantation process of impurity may be required additionally as compared with the prior art, and the CCD linear sensor can be manufactured with less fluctuation from a wafer process standpoint.

In the linear sensor 41 according to this embodiment, similarly as described above, the signal charges photoelectrically converted by the sensor sections 42 are read out through the read-out gate section 44 to the horizontal transfer register 45, are transferred in one direction within the horizontal transfer register 45, are converted into a voltage, and then are outputted through the output section 49. If a large amount of electric charges are generated when the sensor section 42 photo-senses a large quantity of light, the excess electric charges are overflowed from the potential (i.e., so-called potential barrier) $V_{ofb3}$ of the overflow barrier region 45 and are then discharged through the potential Vs of the intermediate region 48 to the overflow drain region 47.

According to the embodiment of the present invention, since the intermediate region 48 having the same structure as that of the sensor section 42 is provided between the overflow barrier region 46 and the overflow drain region 47, in particular, the overflow level in the overflow barrier region 46 can be controlled without adjustment.

More specifically, the intermediate region 48 has the sensor structure having the positive electric charge accumulation area formed on the surface thereof, and this positive electric charge accumulation region is serves as the gate. Therefore, as shown in the potential diagram of FIG. 11B, even when the voltage of the overflow drain region 47 is fluctuated (shown by a dashed line in FIG. 11B), the potential Vs of the intermediate region 48 can be suppressed from being modulated (shown by the dashed line in FIG. 11B). In addition, the potential $V_{ofb3}$ in the overflow barrier region 46 can be suppressed from being modulated by the voltage of the overflow drain region 47 because the intermediate region 48 exists between the overflow barrier region 46 and the overflow drain region 47 from a distance standpoint. Thus, even when the potential of the overflow drain region 47 is fluctuated, the barrier height $\Delta V_{b3}$ can be prevented from being substantially influenced thereby.

If on the other hand the potential Vs of the sensor section 42 is deviated from the design value, as shown by a one-dot chain line in FIG. 11B, the potential $V_{ofb3}$ of the overflow barrier region 46 also is similarly fluctuated, and the barrier height $\Delta V_{b3}$ is not changed substantially. Furthermore, since the length $L_1$ of the overflow barrier region 46 can be set to the same value as that of the prior art, the overflow capability can be prevented from being lowered.

As described above, according to the embodiment of the present invention, the overflow level can be stabilized without adjustment and a stable overflow characteristic can be obtained. Furthermore, the overflow control gate section which adjusts the overflow level by the gate voltage can be removed.

According to the first embodiment of the present invention, when the overflow barrier region 46 is formed, the $N^-$ type impurity diffusion region having a high donor concentration is formed by ion implantation of phosphor or the like over the area ranging from the sensor section 42 to the intermediate region 48. Then, the $N^-$ type impurity diffusion region 58 is formed by local ion implantation of a P-type impurity, such as boron or the like, in the overflow barrier region 46 as described above. The present invention is not limited thereto, and the following variation is also possible. That is, after the $N^-$ type impurity concentration region 58 which becomes the overflow barrier region 46 was formed over the sensor section 42 to the intermediate region 48, N-type impurity concentration diffusion regions 52 and 61 having a high donor concentration may be formed by selectively carrying out additional ion implantation of a N-type impurity over the sensor section 42 and the intermediate region 48 other than the overflow barrier region 46.

Figure 12:
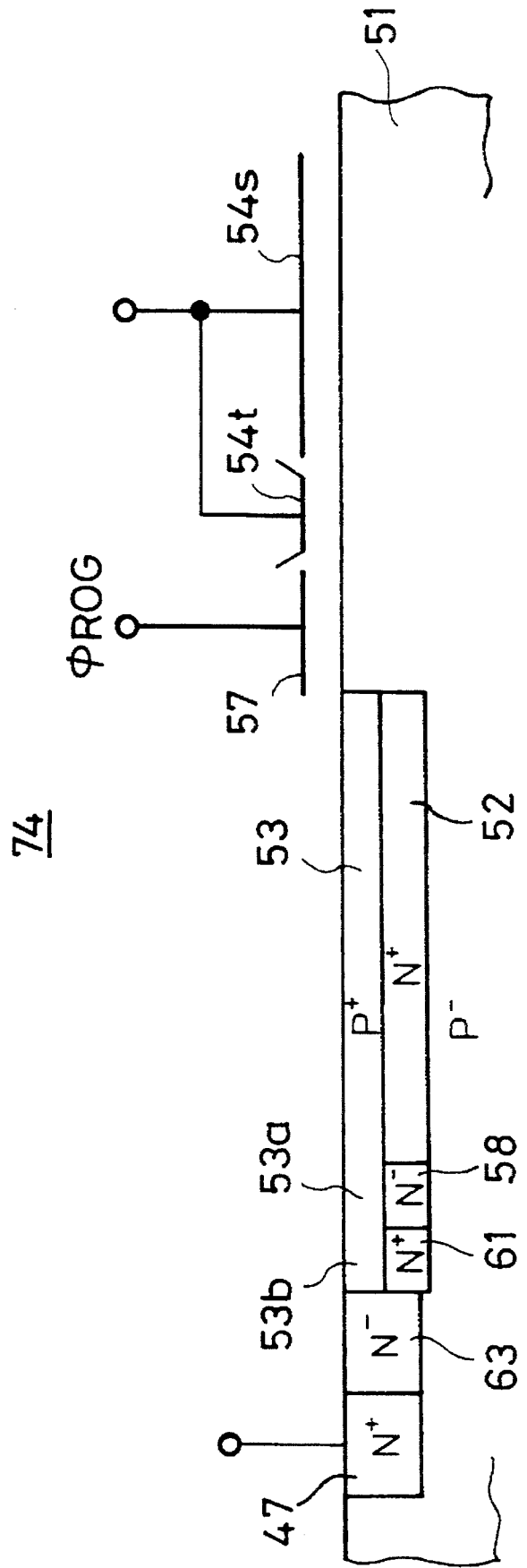
FIG. 12 is a cross-sectional view showing the CCD solid state imaging device according to a second embodiment of the present invention.

FIG. 12 shows a CCD linear sensor 74 according to a second embodiment of the present invention. According to this embodiment, an $N^-$ type impurity diffusion region 63 having a low donor concentration is formed between the overflow drain region 47 and the intermediate region 48, whereby the overflow drain area 47 and the intermediate region 48 may be spaced apart from each other. The rest of the arrangement is the same as that of FIGS. 9 and 11A, and therefore need not be described in detail.

According to the CCD linear sensor 74 shown in FIG. 12, similarly as described above, even when the potential level of the overflow drain region 47 is fluctuated, the barrier height $\Delta V_{ofb3}$ can be prevented from being affected thereby. Further, even when the potential Vs of the sensor section 42 is fluctuated, the barrier height $\Delta V_{OFB3}$ can be prevented from being affected, and the overflow characteristic can be stabilized without adjustment.

While the present invention is applied to the linear sensor as described above, the present invention is not limited thereto and may be applied to the area sensor.

According to the present invention, although the potential level of the overflow drain region is fluctuated, the barrier height can be prevented from being affected substantially, and the stable overflow characteristic can be obtained. Furthermore, although the potential of the sensor section is fluctuated, the barrier height can be prevented from being fluctuated. Therefore, the stable overflow characteristic can be obtained without adjustment.

A third embodiment according to the present invention will be described below.

Figure 13:
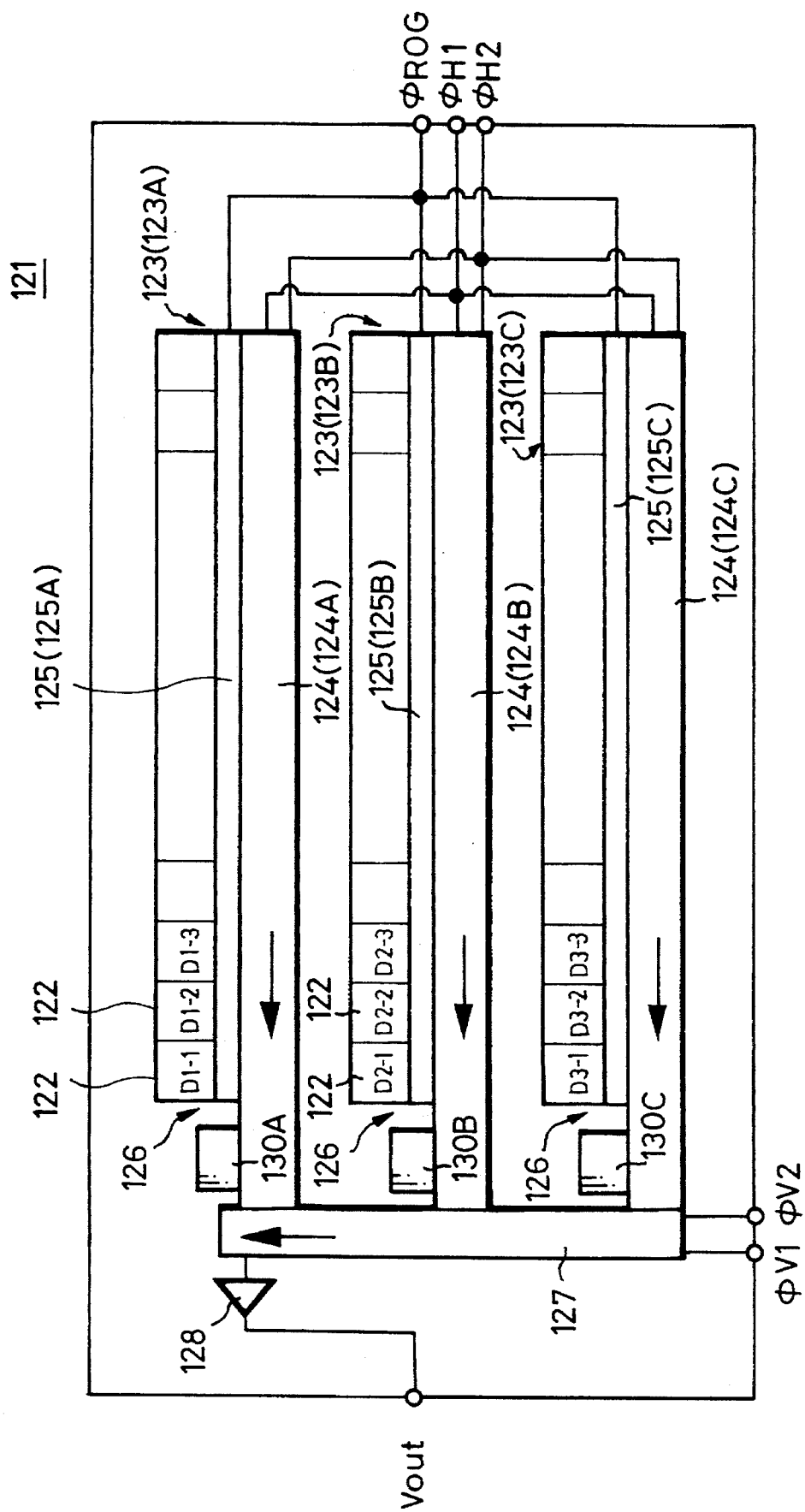
FIG. 13 is a schematic diagram showing a structure of a CCD solid state imaging device according to a third embodiment of the present invention.
Figure 14:
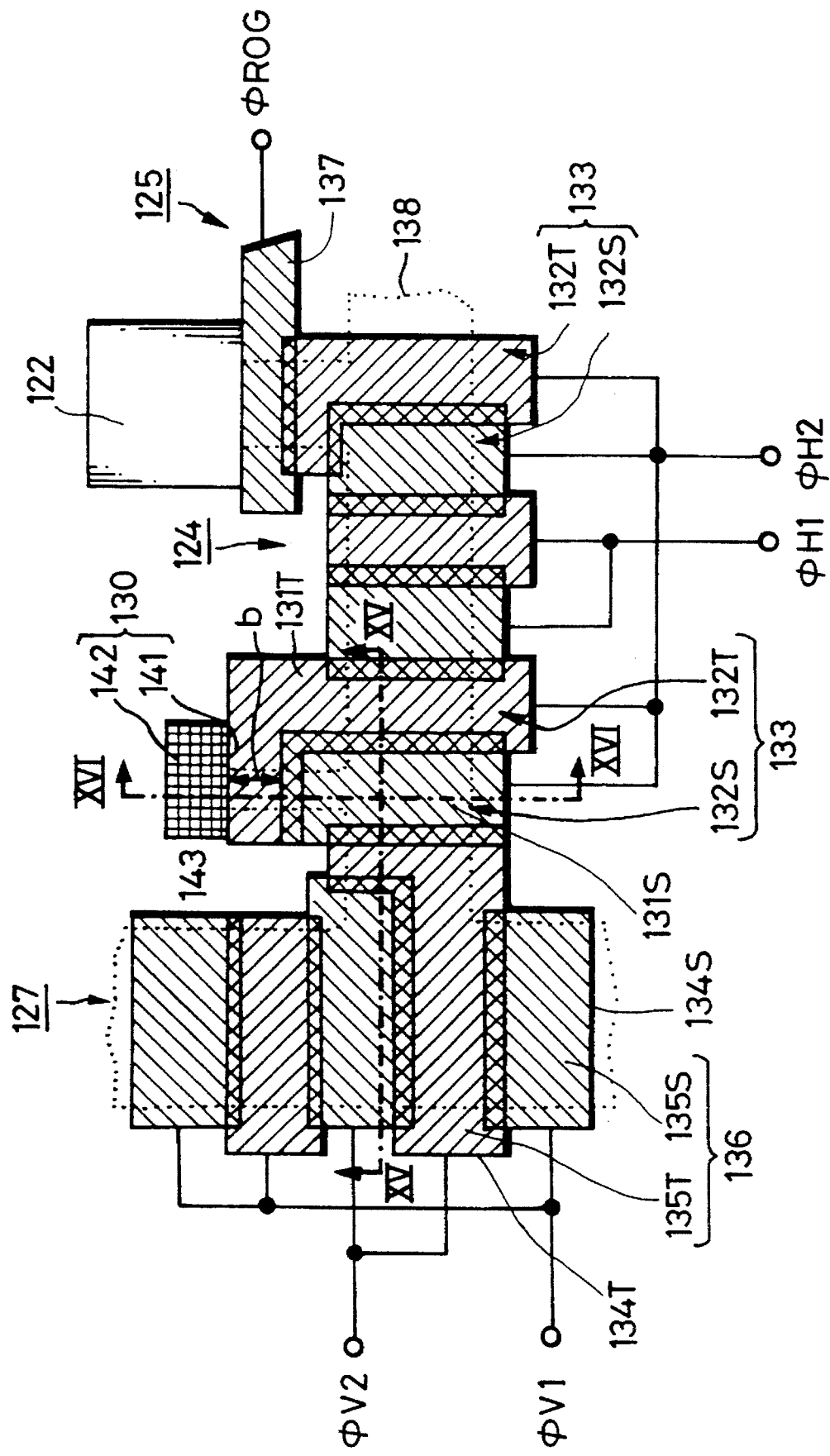
FIG. 14 is a schematic diagram showing a transfer section for transferring signal charges from a horizontal transfer register to a vertical transfer register in an enlarged scale.

FIGS. 13 and 14 show the third embodiment according to the present invention in which the present invention is applied to a CCD solid state imaging device having linear sensors arranged in a plurality of lines and vertical transfer registers added thereto.

Figure 1:
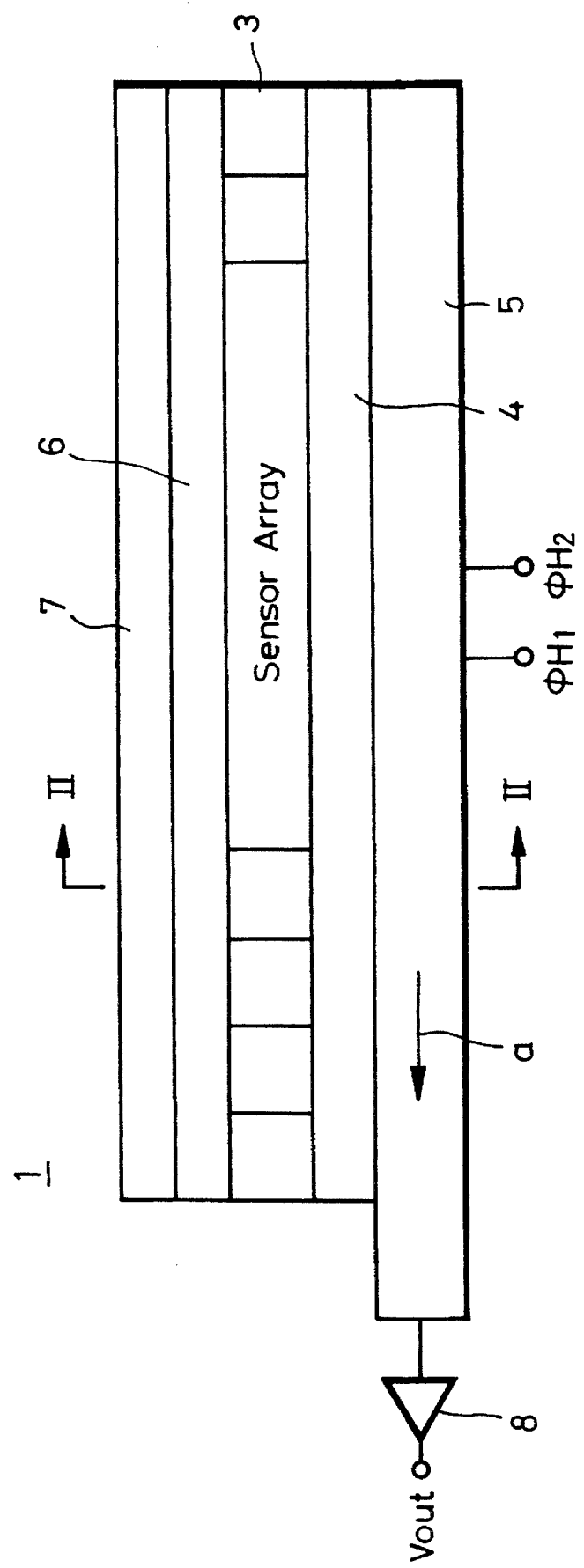
Figure 2A:
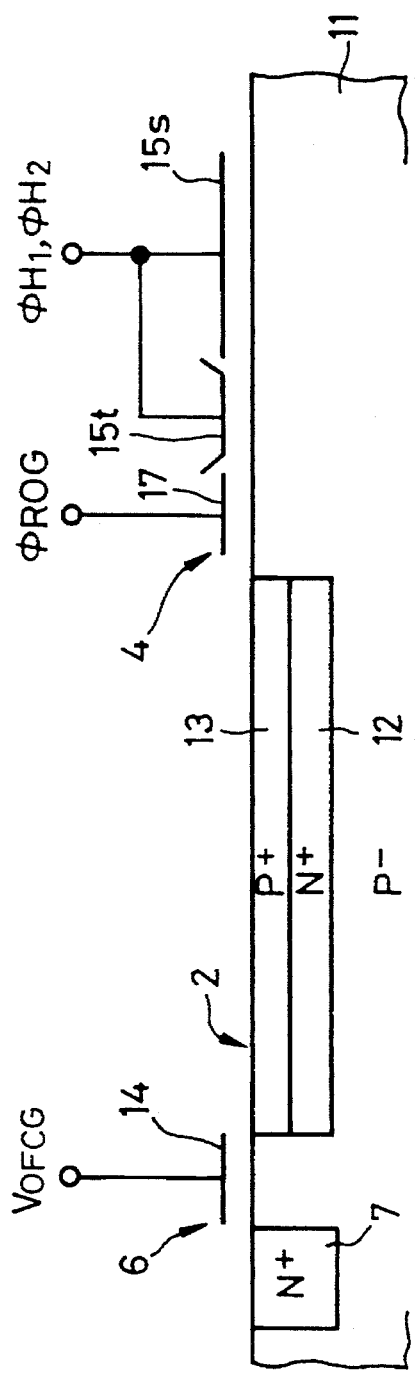
FIG. 2A is a cross-sectional view taken along the line II—II in FIG. 1.
Figure 2B:
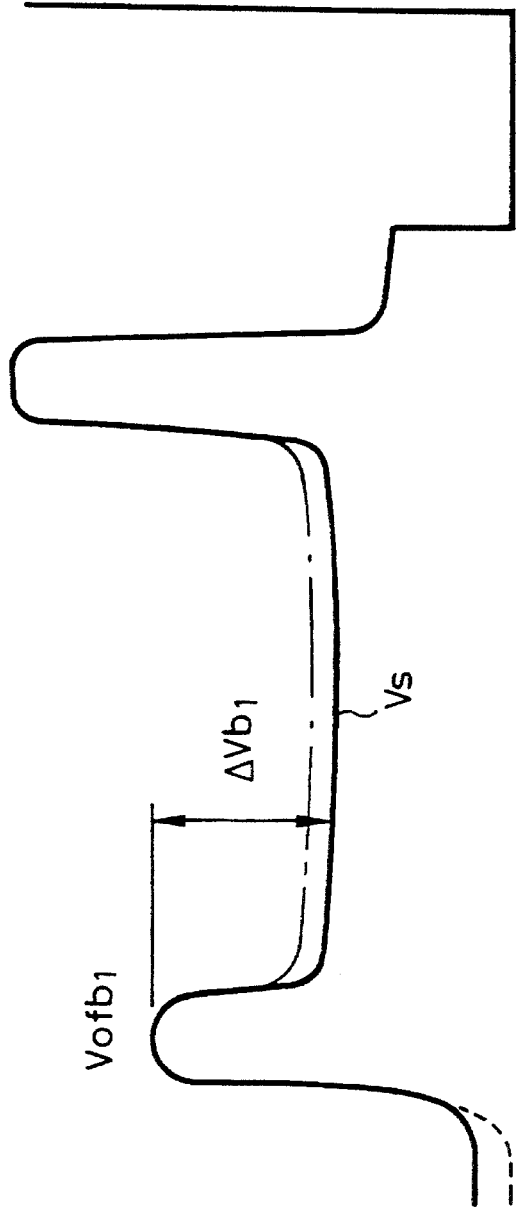
FIG. 2B is a potential diagram used to explain the conventional linear sensor shown in FIG. 1.
Figure 3:
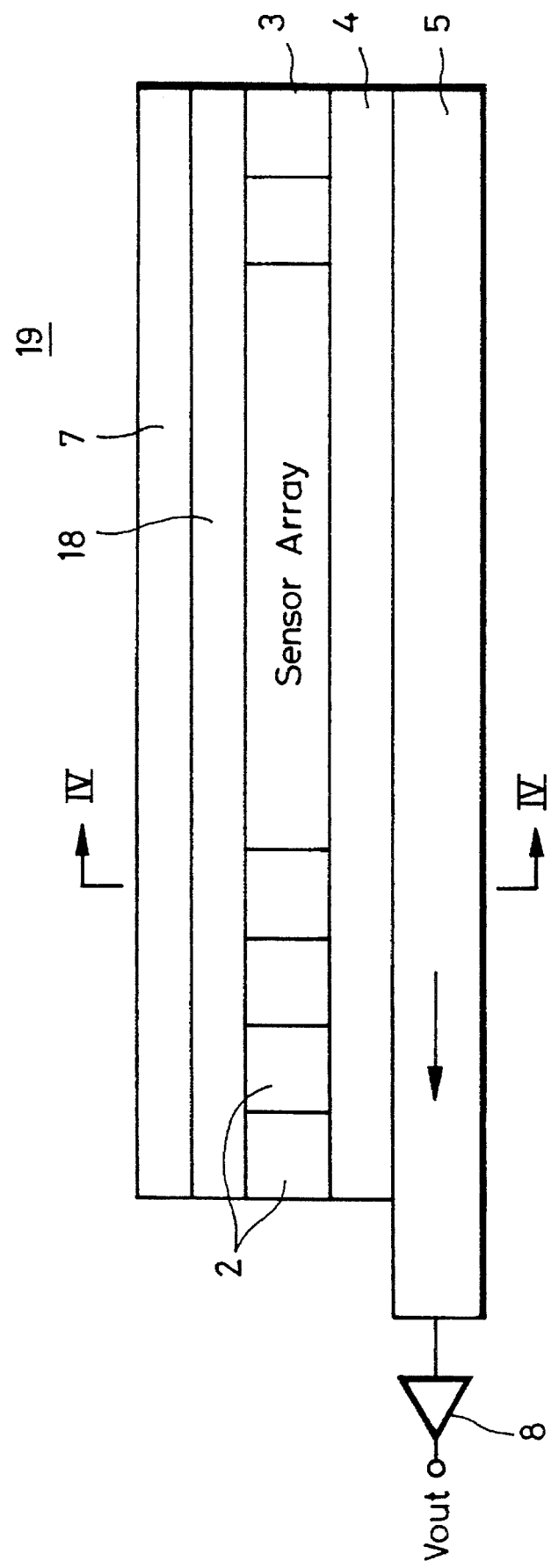
FIG. 3 is a schematic diagram showing a structure of other example of a conventional linear sensor.
Figure 4A:
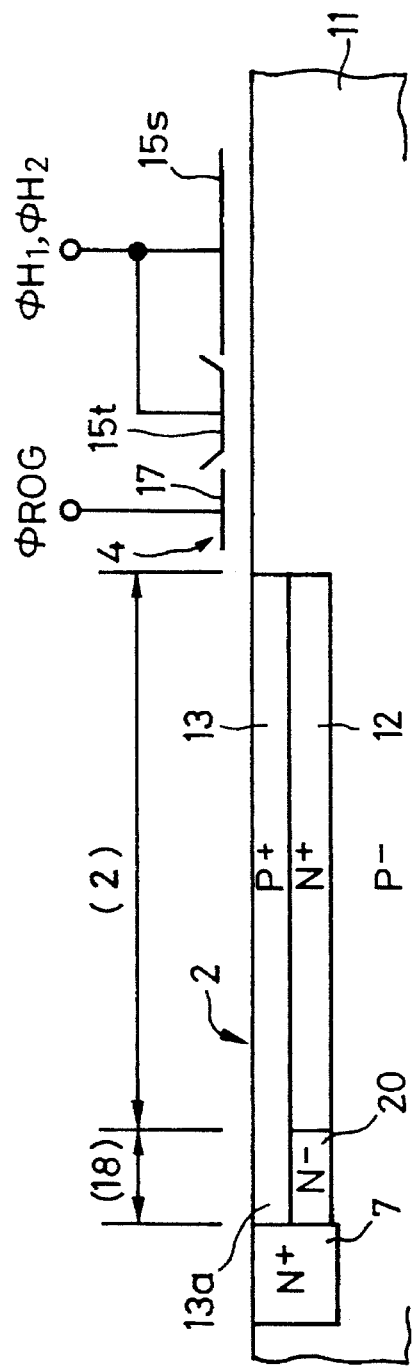
FIG. 4A is a cross-sectional view taken along the line IV—IV in FIG. 3.
Figure 4B:
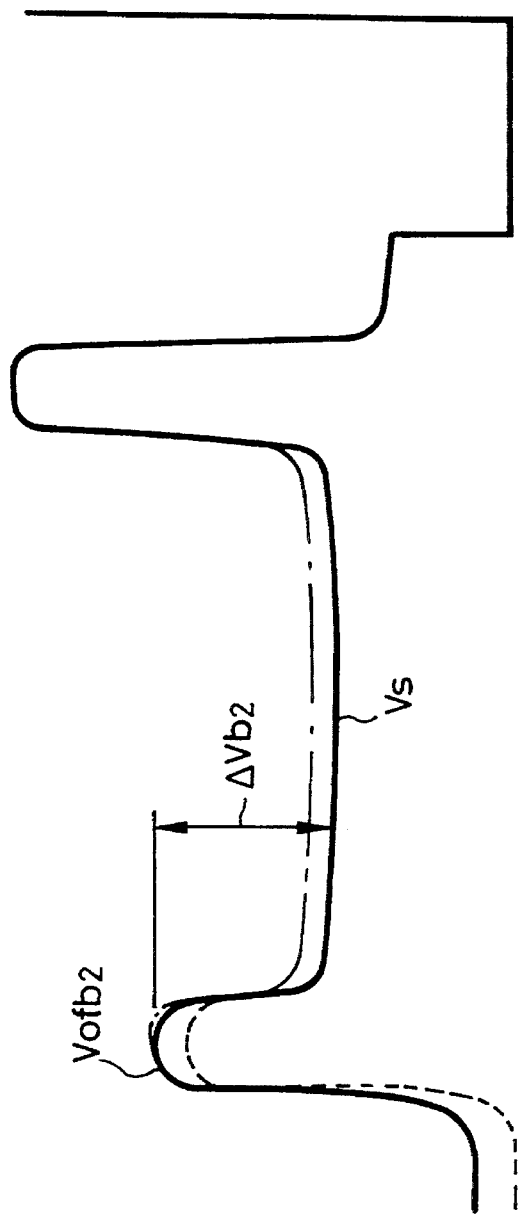
FIG. 4B is a potential diagram used to explain the conventional linear sensor shown in FIG, 3.
Figure 5:
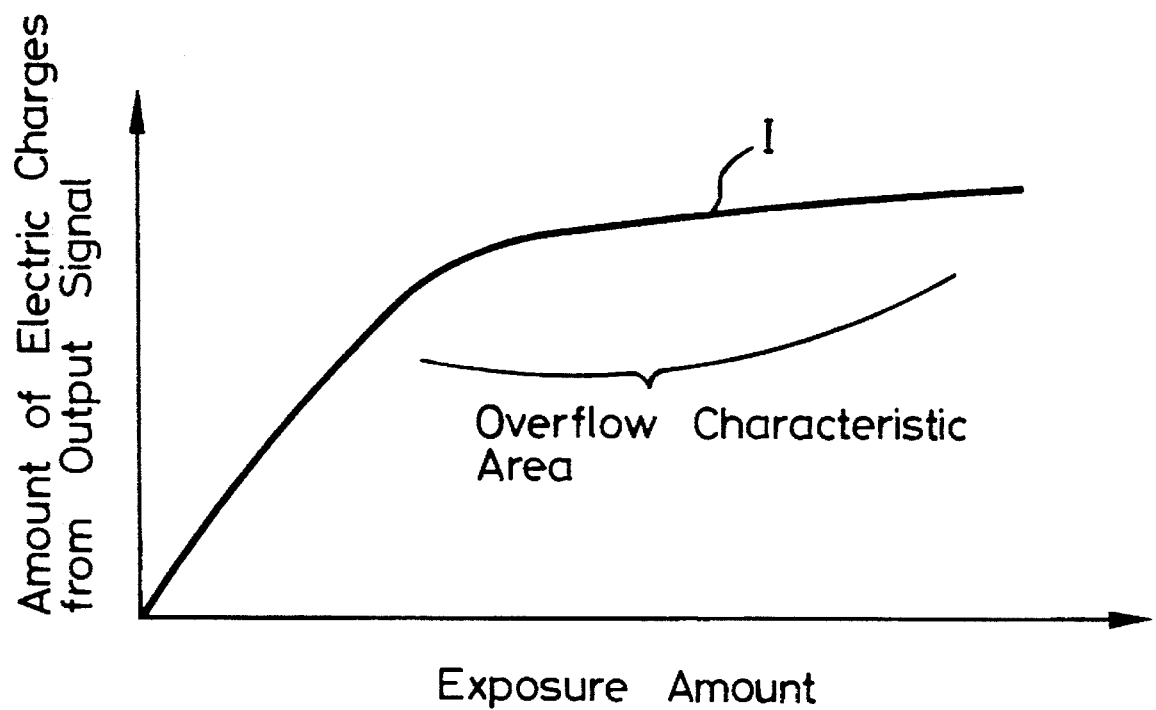
FIG. 5 is a graph showing a relationship between an exposure amount of a sensor section having an overflow characteristic and an amount of signal charges.
Figure 6:
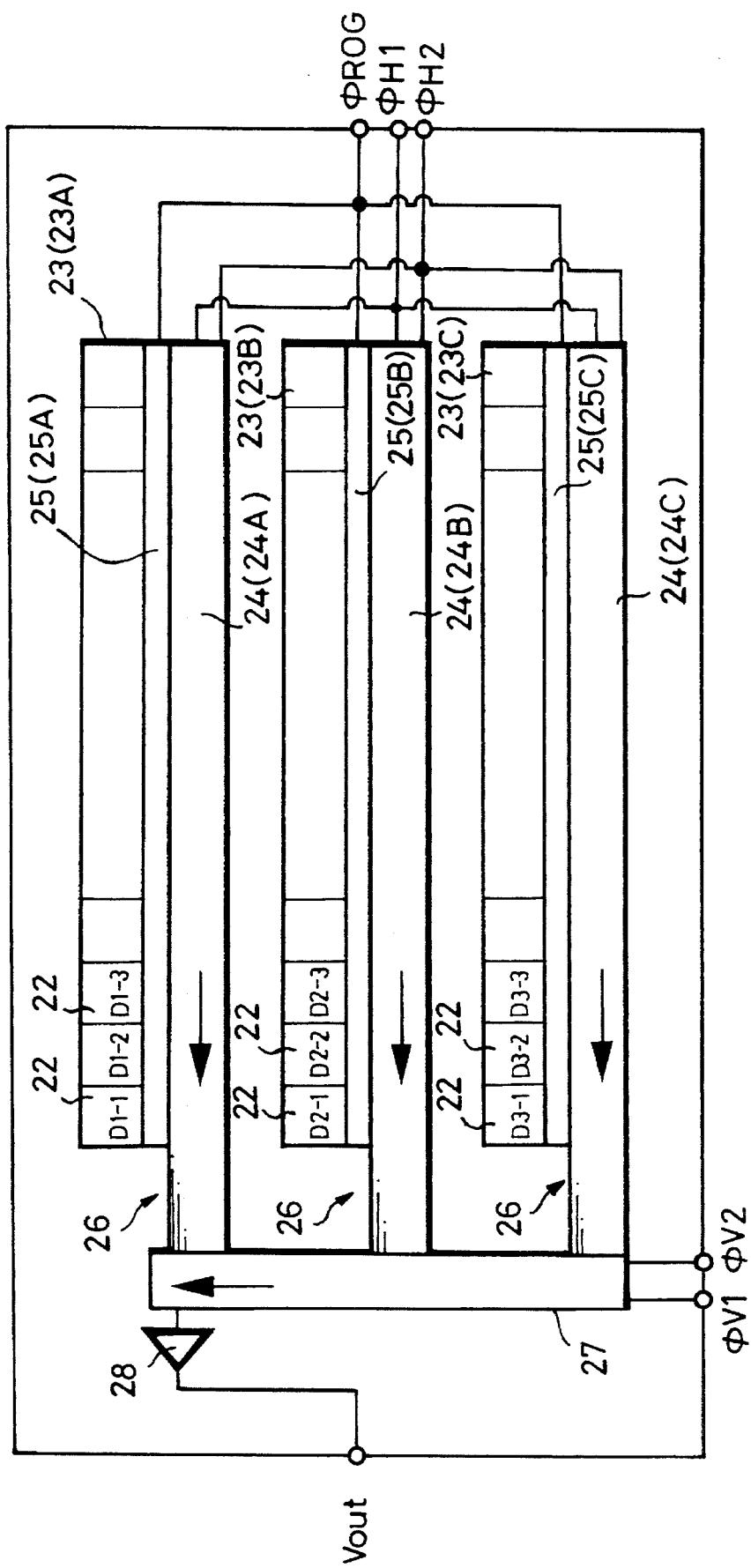
FIG. 6 is a diagram showing a structure of another example of a conventional linear sensor.
Figure 7:
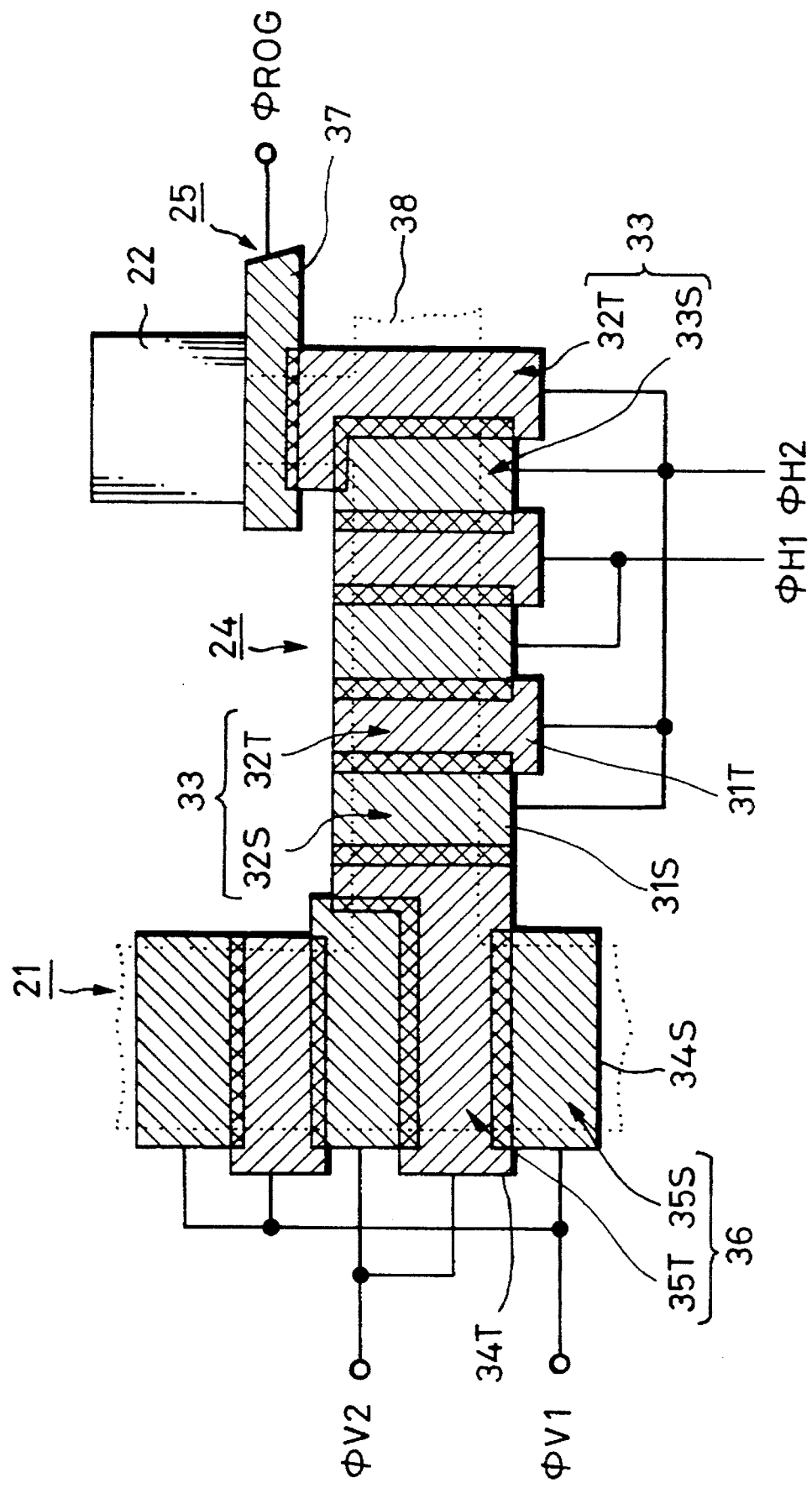
FIG. 7 is a diagram showing a main portion of the conventional linear sensor in an enlarged scale.

As shown in FIGS. 13 and 14, similarly to FIG. 6, a CCD solid state imaging device 121 according to this embodiment includes a plurality of linear sensors 126 provided in a plurality of lines, three lines in correspondence with red (R), green (G) and blue (B), each being formed of a sensor array 123 in which a plurality of sensor sections (photo-sensing sections) 122 which become pixels are arranged in a one-dimensional fashion in the horizontal direction, horizontal transfer registers 124 having a CCD structure provided at one side of the sensor arrays 123 and read-out gate sections 125 provided between the sensor arrays 123 and the horizontal transfer registers 124, and a vertical transfer register 127 having a CCD structure provided at the end of the charge transfer direction of the horizontal transfer registers 124 (124A, 124B, 124C) of respective lines.

At the final stage of the vertical transfer register 127 is provided an output section 128 which includes a charge-to-voltage converting unit for converting signal charges transferred from the vertical transfer register 127 into voltages, and a reset mechanism for resetting the charge-to-voltage converting unit or the like, though not shown.

The CCD solid state imaging device 121 according to this embodiment includes the vertical or horizontal overflow mechanism to discharge excess signal charges from the sensor section 122 to the overflow mechanism when a large quantity of light is irradiated on the sensor sections 122.

Common drive pulses, i.e., two-phase clock pulses $\phi H_1$, $\phi H_2$, are applied to the horizontal transfer registers 124 (124A, 124B, 124C) of the respective lines. A common read-out gate pulse $\phi ROG$ is applied to the read-out gate sections 125 (125A, 125B, 125C), and drive pulses, i.e., two-phase clock pulses $\phi V_1$, $\phi V_2$, are applied to the vertical transfer register 127. The CCD solid state imaging device 171 according to this embodiment corresponds to the color linear sensor of a so-called a R, G, B three line type.

According to this embodiment, in particular, the horizontal transfer registers 124 (124A, 124B, 124C) of respective lines include limit regions 130 (130A, 130B, 130C) adjacent to the preceding transfer sections for transferring signal charges to the vertical transfer register 127 to thereby limit an amount of electric charges transferred to the vertical transfer register 127 by a predetermined amount. The limit regions 130 (130A, 130B, 130C) are comprised of a limit gate section and an overflow drain region, as will be described later on.

As shown in an enlarged diagram forming FIG. 14 (diagram showing the transfer section for transferring signal charges from the horizontal transfer register 124 to the vertical transfer register 127), in the horizontal transfer register 124 of each line, a transfer section 133 is comprised of a storage section 132S having a storage gate electrode 131S formed of a first polycrystalline silicon layer and a transfer section 132T having a transfer gate electrode 131T formed of a second polycrystalline silicon layer. There are formed a plurality of stages of the transfer sections 133.

The storage gate electrode 131S and the transfer gate electrode 131T of each transfer section 133 are connected commonly, and to which the two-phase clock pulses $\phi V_1$, $\phi V_2$ are applied alternately.

In the vertical transfer registers 127, a storage section 135S having a storage gate electrode 134S formed of a first polycrystalline silicon layer and a transfer section 135T having a transfer gate electrode 134T formed of a second polycrystalline silicon layer constitute a transfer section 136. There are formed a plurality of stages of the transfer sections 136.

The storage gate electrode 134S and the transfer gate electrode 134T of each transfer section 136 are connected commonly, and to which the two-phase clock pulses $\phi V_1$, $\phi V_2$ are applied alternately.

A storage section 132 of the transfer section 133 provided at the final stage of the horizontal transfer register 124 is connected to the transfer section 135T of the predetermined transfer section 136 of the vertical transfer register 127.

A gate electrode 137 of the read-out gate section 125 provided between the sensor section 122 and the horizontal transfer register 124 is formed of a first polycrystalline silicon layer. This read-out gate section 135 is connected to the transfer section 132T of the horizontal transfer register 124.

According to this embodiment, a limit gate section 141 is provided adjacent to the storage section 132S of the final transfer section 133 of the horizontal transfer register 124 provided ahead of the vertical transfer register 127, and an overflow drain area 142 formed of N$^+$ type diffusion layer is provided adjacent to the limit gate section 141, thereby constructing the limit area 130.

In the limit gate section 141, the transfer gate electrode 132T of the final stage transfer section 133 of the horizontal transfer register 124 is extended in a hook shape, and the extended portion forms a limit gate electrode 143. An impurity profile of the transfer channel region corresponding to the lower portion of the transfer gate electrode 131T is made the same as the impurity profile of the transfer channel region corresponding to a lower portion of the transfer gate electrode 131T. As shown in FIG. 14, it is simple to make the potential of the limit gate section 141, which determines an amount of electric charges to be limited, the same as that of the transfer section 132T.

A broken line 138 in FIG. 14 depicts a transfer channel region. This transfer channel 138 is partly communicated from the final stage transfer section 133 of the horizontal transfer register 124 through the lower portion of the limit gate section 141 to the overflow drain region 142. On the other hand, in the vertical transfer register 127, a maximum amount of electric charges handled by the transfer section 136 is selected to be more than an amount of electric charges handled by the final stage transfer section 133 of the horizontal transfer register 124 limited by the limit region 130.

Figures 16A, 16B, 16C:
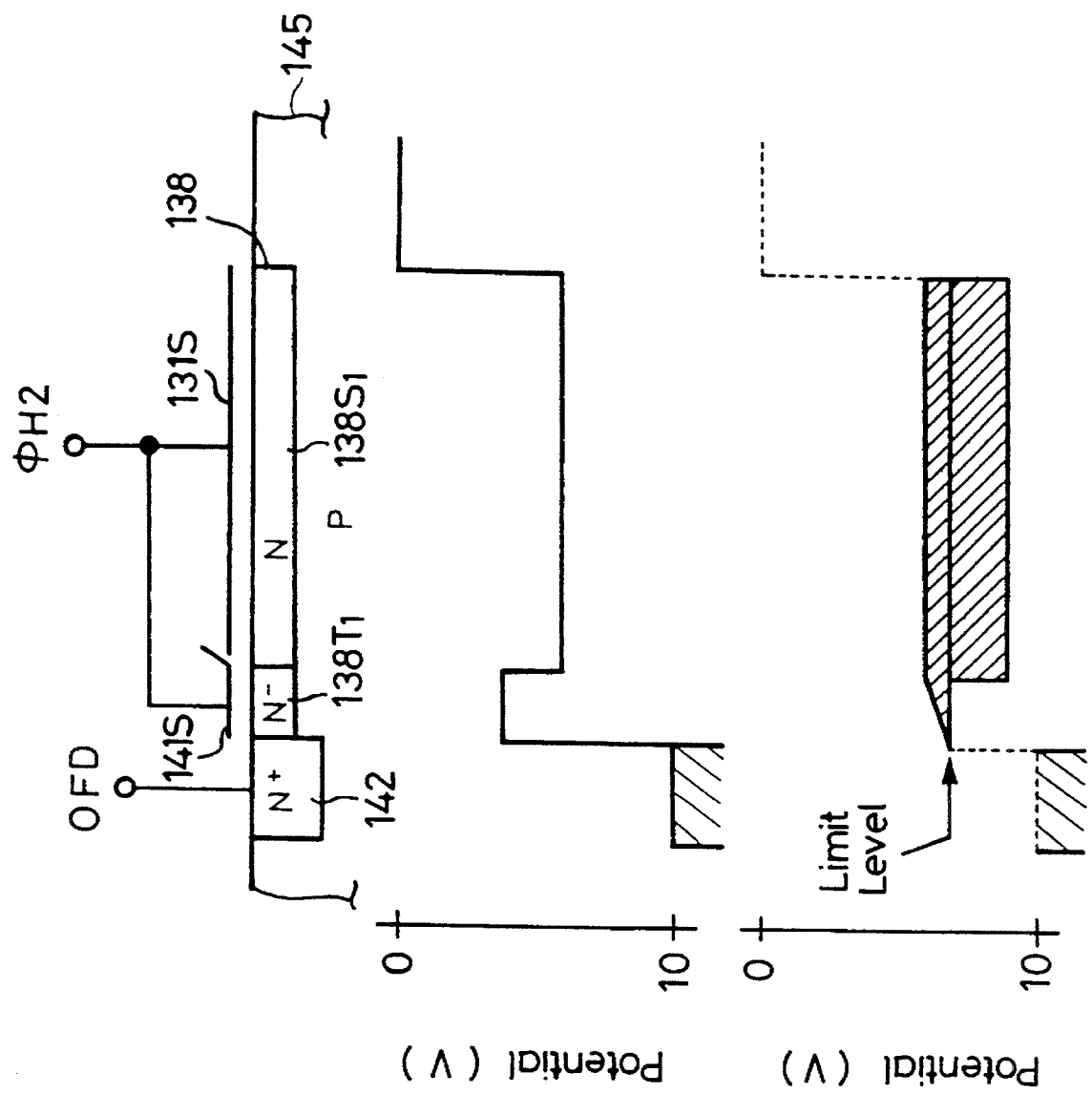
FIG. 16A is a cross-sectional view taken along the line XVI—XVI FIG. 14.
FIGS. 16B, 16C are potential diagrams thereof.

FIG. 15A is a cross-sectional view taken along the line XV—XV in FIG. 14, and FIG. 16A is a cross-sectional view taken along the line XVI—XVI in FIG. 14. As shown in FIGS. 15A and 16A, the N-type transfer channel region 138 is formed on a P-type well region 145, and a transfer channel region provided under the storage gate electrode 131S of the horizontal transfer register 124 is formed of an N-type layer $138S_1$. A transfer channel region provided under the transfer gate electrode 131T is formed of $N^-$ type layer $138T_1$.

A transfer channel region provided under the storage gate electrode 134S of the vertical transfer register 127 is formed of an N-type layer 138S2, and a transfer channel region provided under the transfer gate electrode 134T is formed of an $N^-$ type layer 138T2.

Further, a transfer channel region provided under the limit gate electrode 141 is formed of an $N^-$ type layer $138T_1$, and the overflow drain region 142 is formed of an $N^+$ type layer.

Figure 8:
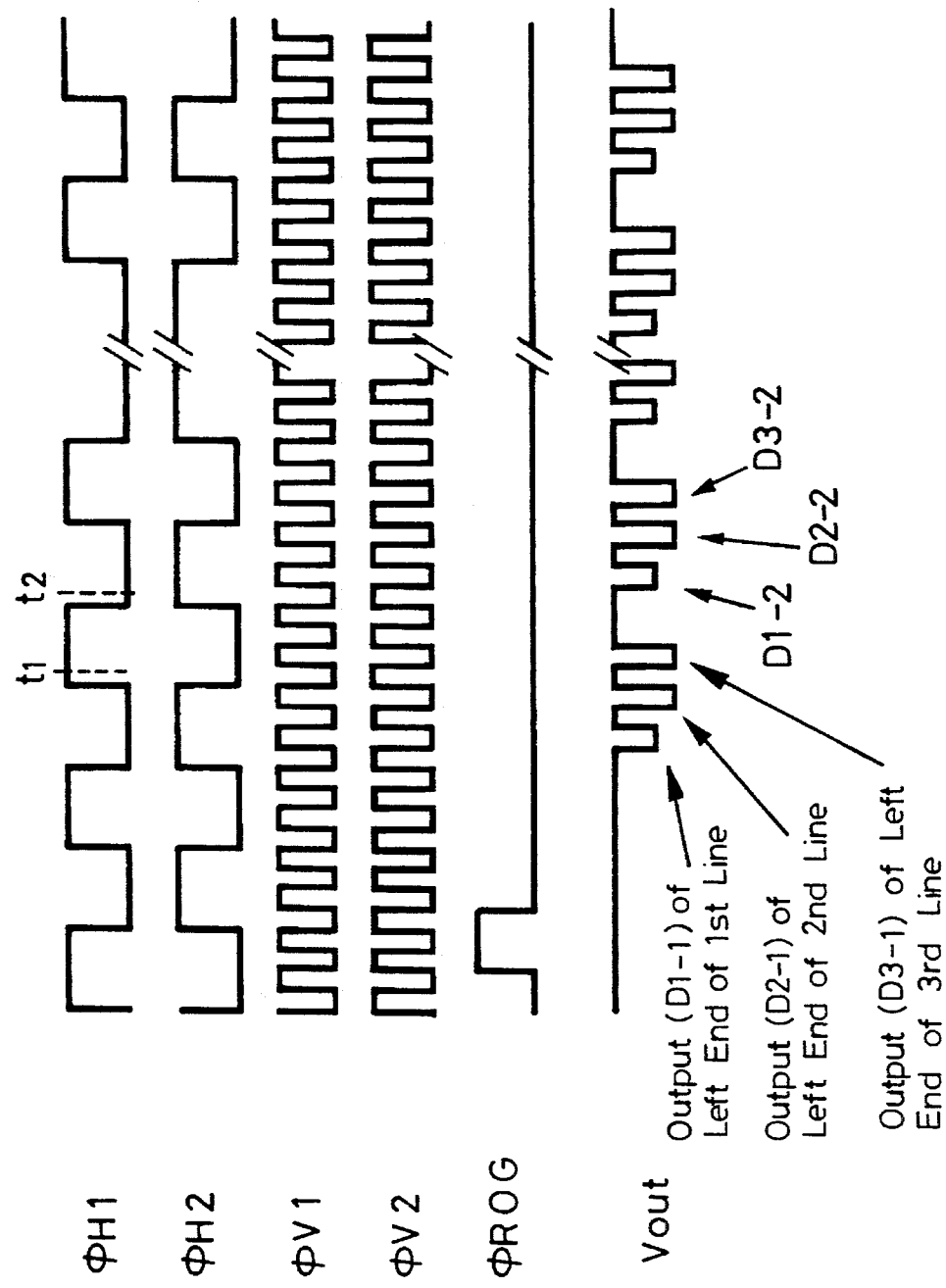
FIG. 8 is a timing chart of clock pulses applied to the conventional linear .Sensor shown in FIG. 6.

The clock pulses $\phi H_1$, $\phi H_2$, $\phi V_1$, $\phi V_2$ and $\phi ROG$ are applied to the aforesaid CCD solid state imaging device at timings similar to those of FIG. 8. Signal charges of the sensor section 122 of the respective sensor arrays 123 (123A, 123B, 123C) are read out through the read-out gate sections 125 (125A, 125B, 125C) to the corresponding horizontal transfer registers 124 (124A, 124B, 124C), transferred within the horizontal transfer registers 124 (124A, 124B, 124C) in the horizontal direction and then sequentially transferred from the horizontal transfer registers 124 (124A, 124B, 124C) to the vertical transfer register 127 at every signal charge of one pixel of each line.

Signal charges of each line transferred to the vertical transfer register 127 are transferred in the vertical direction, converted into voltages, and are then output through the output section 128.

Subsequently, a large amount of photoelectrically converted electric charges generated when a smear occurs in the horizontal transfer register 127, or when a signal is read out, are transferred to the horizontal transfer register 124. Thus, when electric charges are overflowed in a certain section (transfer section 133) in the horizontal transfer register 124, the CCD solid state imaging device according to this embodiment is operated as shown in FIGS. 15B, 15C and FIGS. 16B, 16C.

FIGS. 15B and 16B are potential diagrams showing the case where the electric charges are transferred from the horizontal transfer registers to the vertical transfer register at a timing point $t_1$ (clock pulses $\phi H_1$, $\phi V_2$ are held at a high level and clock pulse $\phi H_2$ is held at a low level), and FIGS. 15C and 16C are potential diagrams showing the case where the electric charges are accumulated at the final stage of the horizontal transfer register, i.e., an amount of electric charges is limited when electric charges are overflowed at a timing point $t_2$ (clock pulses $\phi H_1$, $\phi V_2$ are held at low level and clock pulse $\phi H_2$ is held at a high level).

Let it now be assumed that a large amount of electric charges e are transferred to the transfer section 133 just ahead of the final stage of the horizontal transfer register 124 at the timing point $t_1$ as shown in FIGS. 15B and 16B. When a large amount of electric charges e are transferred to the transfer section 133 of the final stage at the next timing point $t_2$, as shown in FIGS. 15C and 16C, excess electric charges are discharged to the overflow drain region 142 through the limit gate section 141 having the same potential as that of the transfer section 132T. As a consequence, a limited amount of electric charges are transferred to the storage section 132S of the final stage transfer section. Therefore, the limited amount of the electric charges are transferred from the respective horizontal transfer registers 124 (124A, 124B, 124C) to the vertical transfer register 127.

Therefore, according to the CCD solid state imaging device 121 of this embodiment, even when electric charges are overflowed in the horizontal transfer register 124 of one line, for example, the overflowing of electric charges can be prevented from affecting the vertical transfer register 127. Consequently, even though the pixel signal of one line in the horizontal transfer register 124 in which electric charges are overflowed is destroyed (annihilated), pixel signals of other lines can be prevented from being destroyed, and thus signals of all pixels can be avoided from being destroyed.

When the limit gate section 141 is formed by extending the transfer gate electrode 131T of the horizontal transfer register 124, the limit region 130 can be simplified in structure.

While the limit gate section 141 is arranged such that the potential (i.e., so-called channel potential) provided under the gate section becomes equivalent to a potential (i.e., so-called channel potential) provided under the transfer section 132T of the horizontal transfer register 124 as described above, the present invention is not limited thereto and the potential provided under the limit gate section 141 may be set to be deeper than the potential provided under the transfer section 132T. This method is more effective in order to obtain a larger margin in actual practice.

More specifically, if a channel length b of the limit gate section 141 is made short, then the potential provided under the limit gate section 141 can be set to be deeper than the potential provided under the transfer section 132T by the modulation from the overflow drain region 142 and the storage section 132S.

Alternatively, if the impurity concentration profile of the transfer channel region provided under the limit gate electrode 143 is made different from that of the transfer channel region provided under the transfer gate electrode 131T, i.e., the impurity concentration provided under the limit gate electrode 143 is made larger than that provided under the transfer gate electrode 131T, then the potential provided under the limit gate section 141 can be set to be deeper than that provided under the transfer section 132T.

While the limit gate electrode 143 is formed by extending the transfer gate electrode 131T as described above, the present invention is not limited thereto and the limit gate electrode 143 may be formed independently of the transfer gate electrode 131T.

Further, while the limit region 130 is provided in the transfer section 133 of the final stage of the horizontal transfer register 124, the present invention is not limited thereto and the limit region 130 may be provided over the transfer section provided ahead of the final stage or transfer sections of a plurality of stages.

The present invention can be applied to the area sensor and the linear sensor, and can also be applied to charge-coupled devices other than the CCD solid state imaging device.

According to the present invention, even when the electric charges are overflowed in a part of the first transfer register, electric charges can be prevented from being overflowed in the second transfer register. Accordingly, only the signal in the first transfer register of that line is destroyed, and signals in the first transfer register of other lines can be avoided from being destroyed. Furthermore, the limit region can be simplified in structure more reliably, and the amount of electric charges can be limited by the limit region more reliably.

Having described preferred embodiments of the invention with reference to the accompanying drawings, it is to be understood that the invention is not limited to those precise embodiments, and that various changes and modifications could be effected therein by one skilled in the art without departing from the spirit or scope of the invention as defined in the appended claims.

What is claimed is:

1. A CCD solid state imaging device, comprising:

a photoelectric converting section comprising a first conductivity type impurity diffusion region in a semiconductor substrate as a well region;

a charge read-out section for reading out signal charges photoelectrically-converted by said photoelectric converting section;

an overflow drain region of first conductivity type in said well region and extending up to a surface thereof for discharging excess electric charges supplied thereto from said photoelectric converting section;

an overflow barrier region of first conductivity type in said well region and directly adjacent to said impurity diffusion region for determining a level of excess electric charges supplied thereto from said photoelectric converting section;

an intermediate region of first conductivity type in said well region provided between said overflow drain region and said overflow barrier region, said intermediate region having a potential deeper than that of said overflow barrier region and which is shallower than that of said overflow drain region; and a second conductivity type electric charge accumulation region at said surface of said well region and directly overlying and in direct abutting contact with said impurity diffusion region, said overflow barrier region, and said intermediate region, and alongside but not overlying said overflow drain region.

2. The CCD solid state imaging device according to claim 1, wherein said overflow drain region formed in said semiconductor substrate is formed adjacent to said intermediate region.

3. The CCD solid state imaging device according to claim 1, wherein said overflow drain region is formed within said semiconductor substrate, and said intermediate region and overflow drain region are spaced apart from each other.

4. A device according to claim 1 wherein another first conductivity type impurity diffusion region is provided in said well region extending up to the surface thereof and positioned between said overflow drain region and said intermediate region.

5. A CCD solid state imaging device, comprising:

a photoelectric converting section formed on the surface of a semiconductor substrate;

a charge read-out section for reading out signal charges photoelectrically-converted by said photoelectric converting section;

an overflow drain region for discharging excess electric charges supplied thereto from said photoelectric converting section;

an overflow barrier region for determining a level of excess electric charges supplied thereto from said photoelectric converting section;

an intermediate region provided between said overflow drain region and said overflow barrier region, said intermediate region having a potential deeper than that of said overflow barrier region and which is shallower than that of said overflow drain region; and said intermediate region having a same potential as that of said converting section.

6. A charge coupled device, comprising:

a photo-sensing section for accumulating signal charges when said photosensing section photo-senses light;

a first transfer section for transferring said signal charges in one direction;

a second transfer section provided at an end portion in a signal transfer direction of said first transfer section; and a signal charge limiting structure for limiting an amount of signal charges supplied to said second transfer section from said first transfer section, said structure comprising an overflow drain region positioned laterally outwardly of a first transfer gate electrode at an end of said first transfer section and extending in a direction perpendicular to said direction of transferring of said signal charges, and wherein said first transfer gate electrode is extended laterally outwardly perpendicular to said transferring signal charge direction and outwardly of other transfer electrodes in said first transfer section so as to form a limit gate section positioned between a second transfer gate electrode at the end of said first transfer section adjacent to said first transfer gate electrode and said limit gate section.

7. The charge coupled device according to claim 6, wherein said first transfer section is comprised of a plurality of first transfer registers arranged in one direction.

8. The charge coupled device according to claim 6, wherein said gate section has a potential which is set to be deeper than that of a transfer gate section of said first transfer section.

* * * * *